US008038079B2

(12) United States Patent
Pirkl

(10) Patent No.: US 8,038,079 B2
(45) Date of Patent: Oct. 18, 2011

(54) INJECTION SYSTEM AND A METHOD FOR PRODUCING AN INJECTION SYSTEM

(75) Inventor: Richard Pirkl, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 150 days.

(21) Appl. No.: 11/745,798

(22) Filed: May 8, 2007

(65) Prior Publication Data

US 2008/0001010 A1 Jan. 3, 2008

(30) Foreign Application Priority Data

May 9, 2006 (EP) .................................... 06009556

(51) Int. Cl.

| | |
|---|---|
| ***B05B 1/08*** | (2006.01) |
| ***B05B 3/04*** | (2006.01) |
| ***B05B 1/30*** | (2006.01) |
| ***F02M 59/00*** | (2006.01) |
| ***F02M 51/00*** | (2006.01) |
| ***H01L 41/00*** | (2006.01) |

(52) U.S. Cl. ............... 239/102.2; 239/102.1; 239/533.2; 239/584; 239/585.1; 239/585.3; 310/328; 310/365

(58) Field of Classification Search ............... 239/102.2, 239/533.2, 584, 585.1, 585.3, 102.1; 310/328, 310/365

See application file for complete search history.

(56) References Cited

U.S. PATENT DOCUMENTS 4,471,256 A * 9/1984 Igashira et al. ............... 310/328
6,474,565 B1 * 11/2002 Ruehle et al. .............. 239/102.1
6,874,475 B2 * 4/2005 Katsura et al. ................ 123/467
6,969,009 B2 * 11/2005 Bachmaier et al. ........ 239/102.2
7,036,198 B2 5/2006 Hardy et al.
7,111,500 B2 * 9/2006 Itoh et al. ..................... 73/54.41
7,394,184 B2 * 7/2008 Plecher et al. ................ 310/340
2004/0108481 A1 6/2004 Albert et al.
2005/0017096 A1 * 1/2005 Bachmaier et al. ........... 239/584
2005/0077379 A1 * 4/2005 Augustin et al. ........... 239/102.2
2006/0038030 A1 2/2006 Plecher et al.

FOREIGN PATENT DOCUMENTS

EP 1420467 A2 5/2004
EP 1431568 A2 6/2004
WO 02/061856 8/2002

OTHER PUBLICATIONS

European Search Report, EP 06009556.9-1263, 3 pages, Oct. 6, 2006.

* cited by examiner

*Primary Examiner* — Jason Boeckmann
*Assistant Examiner* — Ryan Reis
(74) *Attorney, Agent, or Firm* — King & Spalding L.L.P.

(57) ABSTRACT

An injection system for injecting fuel has:

a housing for containing the fuel, with a first and second aperture, a piezo actuator having a first and second face plate aperture, a controllable piezo stack arranged between the face and base plate, a sealed casing laterally surrounding at least the piezo stack and arranged between the face and base plate and a transmission means arranged in an actuator interior space having a fluid, a first contact device guided through the first aperture and face plate aperture, a second contact device guided through the second aperture and face plate aperture, a first sealing device surrounding the contact device near the apertures and providing a seal between the housing interior and exterior space and a second sealing device surrounding the contact devices near the face plate apertures and providing a seal between the housing interior space and the actuator interior space.

16 Claims, 2 Drawing Sheets

INJECTION SYSTEM AND A METHOD FOR PRODUCING AN INJECTION SYSTEM

CROSS-REFERENCE TO RELATED APPLICATION

This application claims priority to European application number EP06009556, which was filed on May 9, 2006, and is incorporated herein by reference in its entirety.

TECHNICAL FIELD

The invention relates to an injection system having a piezo actuator arranged in the high pressure space and a method for producing such an injection system.

BACKGROUND

Injection systems and in particular leakage oil-less common rail injection systems require a control element, such as a piezo actuator in the high pressure space for instance. To ensure the working capacity of the piezo actuator also under high pressures of up to 2000 bar, the pressure must also be able to laterally act on the piezo stack or, as applicable, the piezo ceramic body, in order to assist with the expandability of the piezo stack of the piezo actuator.

Such a piezo actuator is described for instance in WO 02/061856 A1. In this context, the ceramic body of this piezo actuator is encased with a polymer or plastic collar. However, a hermetic seal of the ceramic body in respect of the highly pressurized fuel, such as for instance 2000 bar, is hardly or not feasible in the case of the plastics known on the date of filing of the present patent application. Due to an occasional unavoidable electrical conductibility of conventional fuels, as a result of a minimal acid content for instance, it is already possible for voltage sparkovers to occur between the internal electrodes of the piezo actuator even with minimal wetting of the piezo ceramic. In addition, high expansions of the plastic casing occur on the polarity flaws, which intensify this problem. Furthermore, WO 02/061856 describes the use of a filling material between the piezo stack and the polymer or plastic collar. With the described filling material, the problem nevertheless exists in that said filling material can flow into existing spaces or joints if the piezo stack expands and can be destroyed if the piezo stack moves in the opposite direction. The filling material is thus deposited or destroyed during the period of operation of the piezo actuator. The reduced filling material nevertheless specifies that the pressure present on the exterior of the piezo actuator can no longer be efficiently transmitted to the piezo stack.

Furthermore, a solution using a hermetically sealed, metallic sleeve to transmit the pressure to the piezo stack of the piezo actuator is known internally to the applicant, said solution providing an actuator interior space between the piezo stack and the sleeve. In the actuator interior space, a filler, e.g. a silicon oil, is provided to transmit the hydraulic forces onto the side surfaces of the piezo ceramic body. This solution known internally to the applicant is however disadvantageous in that the seal between the piezo stack and the sleeve, at the point at which an electrical pin passage or contact device for contacting and controlling the piezo stack is guided through the seal, does not remain hermetically sealed in the case of longer periods of operation and in particular with high pressures, such as 2000 bar. In the event of a leakage, the risk thus exists that the filler could escape from the actuator interior space. A filler leakage could render the piezo actuator and thus the injection system inoperable.

SUMMARY

An injection system having a piezo actuator arranged in the high pressure space can be provided, which ensures a hermetic and in particular long-term stable seal of the actuator interior space, in particular within the region of the passage of the contact device.

Furthermore a temperature-stable seal of the actuator interior space can be ensured.

According to an embodiment, an injection system for injecting fuel with a predetermined fuel pressure may comprise:

- a housing, which comprises a housing interior space, which has the fuel, a first housing aperture and a second housing aperture,
- a piezo actuator arranged in the housing interior space, which has a face plate, which has a first face plate aperture and a second face plate aperture, a controllable piezo stack which is arranged between the face place and the base place, a sealed casing which laterally surrounds at least the piezo stack and is arranged between the face plate and the base plate and a transmission means which is arranged in an actuator interior space which comprises at least one fluid with a hydraulic pressure,
- a first contact device, which is guided through the first housing aperture and the first face plate aperture,
- a second contact device, which is guided through the second housing aperture and the second face plate aperture,
- a first sealing device, which surrounds the contact devices in the region of the housing apertures and provides a seal between the housing interior space and an exterior space with a predetermined exterior space pressure for instance atmospheric pressure, and
- a second sealing device, which surrounds the contact devices in the region of the face plate apertures and provides a seal between the housing interior space and the actuator interior space.

BRIEF DESCRIPTION OF THE DRAWINGS

The invention is now described in more detail below with reference to the schematic figures of the specified exemplary embodiments, in which.

The same and/or functionally-similar elements and units, provided nothing else is specified, have been provided with the same reference characters in all the figures.

DETAILED DESCRIPTION

Figure 1:
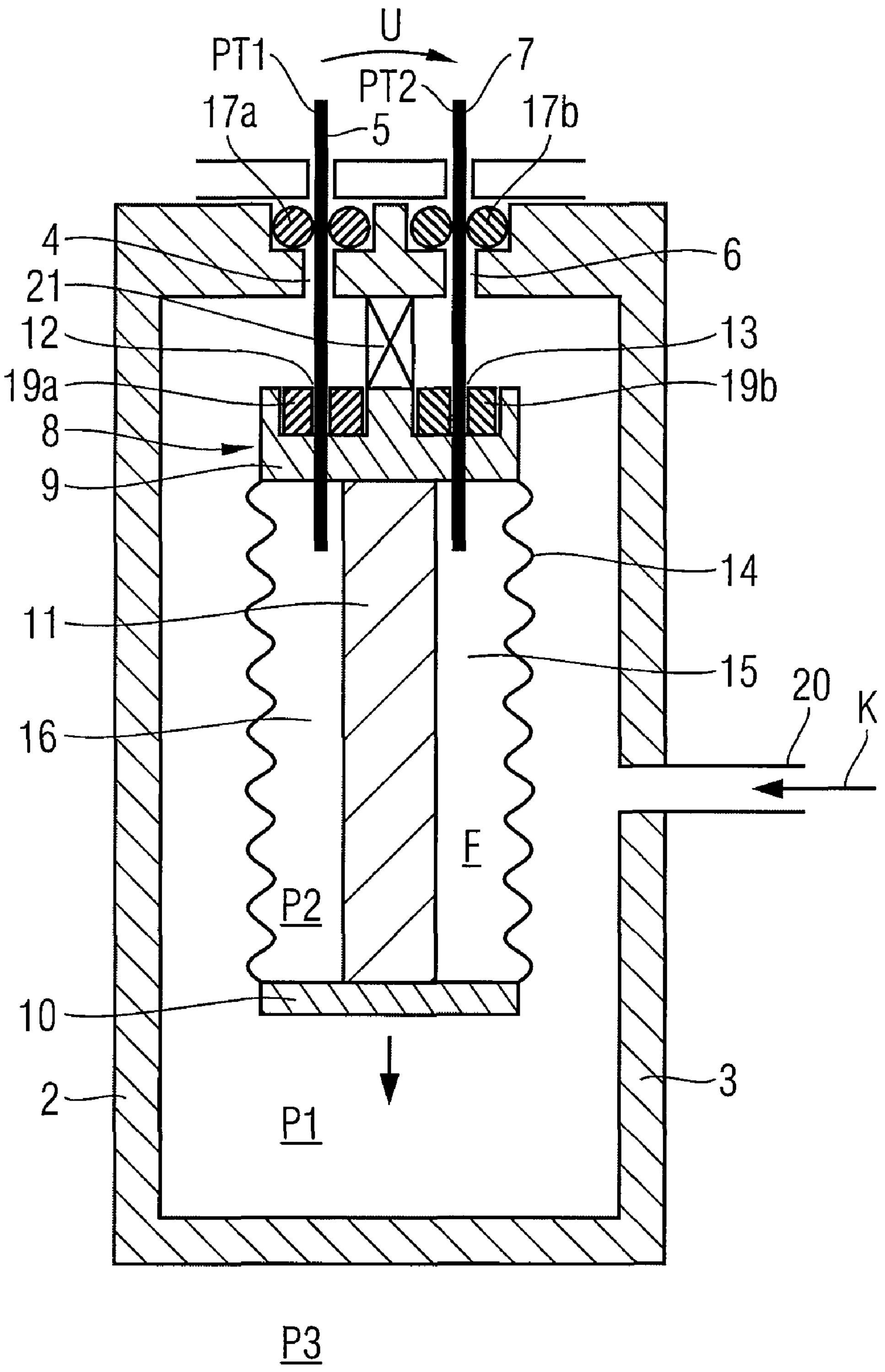
FIG. 1 shows a schematic longitudinal sectional view of a preferred exemplary embodiment of the injection system.

One advantage according to an embodiment consists in the actuator interior space being hermetically sealed in respect of the housing interior space or the high pressure space of the injection system, so that no mass transfer can take place between the actuator interior space and the housing interior space.

The injection system according to various embodiments provides a function separation, which ensures the hermetic seal of the actuator interior space. The seal of the fuel with the fuel pressure of for instance 2000 bar (first function) compared with the exterior space with exterior space pressure, for instance atmospheric pressure, is provided by the first sealing device. The first sealing device has accordingly to seal a pressure difference of approximately 2000 bar. The first sealing device must however not necessarily ensure a hermetic seal since fuel is always tracked with 2000 bar. The second function, namely sealing the actuator interior space in respect of the housing interior space, is provided by the second sealing device. In the housing interior space, a fuel pressure of 2000 bar for instance prevails, which is transmitted to the piezo stack by means of the transmission means which contains the liquid with the hydraulic pressure. Consequently, pressure differences prevail between the housing interior space and the actuator interior space, said pressure differences being very small in comparison with the pressure differences between the housing interior space and exterior space and possibly amounting to a maximum of 200 bar for instance. These pressure differences are dependent in particular on the embodiment form of the casing, for instance as a corrugated tube. The second sealing device thus only has to seal partial pressure differences as opposed to the first sealing device, said partial pressure differences being able to amount in all instances to 200 bar. As a result of the minimal pressure differences, which the second sealing device has to seal, the actuator interior space is hermetically sealed. In particular, this leak tightness can also be ensured for long periods of operation, and in particular for temperatures and temperature differences arising during operation.

According to an embodiment, the transmission means can be suited to transmit the fuel pressure present on the exterior of the casing to the piezo stack.

According to an embodiment, the controllable piezo stack may provide a lift as a function of a control voltage in order to actuate a nozzle needle.

According to a further embodiment, the first contact device and the second contact device may contact the piezo stack in order to control the piezo stack. In this way, the first contact device contacts a first outer electrode of the piezo stack for instance and the second contact device contacts a second outer electrode of the piezo stack. To control the piezo stack, the first contact device is disposed on a first electrical potential and the second contact device is disposed on a second electrical potential. To this end, the first contact device is connected for instance to a positive pole of a voltage supply and the second contact device is connected to a negative pole of the voltage supply. The difference between the first electrical potential and the second electrical potential forms the control voltage.

According to a further embodiment, the actuator interior space can be restricted by the base plate, the face plate, the casing and by the piezo stack.

According to a further embodiment, the housing may comprise a supply device for supplying the fuel with a predetermined fuel pressure into the housing interior space.

According to a further embodiment, the first sealing device may have a first O-ring-shaped sealing element, which surrounds the first contact device in the region of the first housing aperture in a sealed manner, and a second O-ring-shaped sealing element, which seals the second contact device in the region of the second housing aperture in a sealed manner.

According to a further embodiment, the first O-ring-shaped sealing element and/or the second O-ring-shaped sealing element can be formed from a plastic, in particular from an elastomer.

According to a further embodiment, the second sealing device may comprise a first sealing element, which surrounds the first contact device in the region of the first face plate aperture in a sealed manner, and a second sealing element, which surrounds the second contact device in the region of the second face plate aperture in a sealed manner.

According to a further embodiment, the first sealing element and/or the second sealing element may consist of a glass. Glass as a sealing element between the actuator interior space and the housing interior space has the advantageous attribute of being very temperature stable. The leak tightness of the actuator interior space is thus ensured even in the event of extreme temperature fluctuations and/or very lengthy loads at high temperatures.

According to a further embodiment, the fuel pressure in the housing interior space can be greater than 1500 bar, in particular greater than 2000 bar.

According to a further embodiment, a pressure difference can be produced between the fuel pressure and the fluid pressure in the actuator interior space during the transmission of the fuel pressure to the piezo stack, the pressure difference being less than or equal to 200 bar. A pressure difference of 200 bar only results in the event of extreme edge conditions, so that the fuel pressure and the fluid pressure are generally approximately identical. A partial pressure difference thus exists between the fuel pressure and the fluid pressure, which is generally approximately zero, so that as a result of the inventive function separation of the hermetic seal and the seal of the fuel pressure against atmospheric pressure, glass can be used as a hermetically sealing sealant between the actuator interior space and the housing interior space.

According to a further embodiment, the transmission means may have the fluid and at least one preformed body, which consists in particular of a ceramic.

According to a further embodiment, the casing can be designed as a corrugated tube, which comprises a plurality of ripples and is in particular metallic.

According to a further embodiment, the fluid can be temperature-resistant and/or heat-conductive and/or electrically-insulating. The fluid is advantageously temperature-resistant so that temperature fluctuations do not have an effect on the attributes of the fluid. The fluid is advantageously also heat-conductive, so that no considerable expansion differences can occur with the casing and the piezo stack during a temperature change. Furthermore, the fluid is also preferably electrically-insulating, so that no electrical sparkover can occur between the outer electrode of the piezo stack and the metallic casing. The fluid is preferably a silicon oil.

According to a further embodiment, the injection system may be a common rail injection system.

FIG. 1 shows a schematic longitudinal sectional view of an exemplary embodiment of the injection system 1 for injecting fuel K with a predetermined fuel pressure P1 into a nozzle or valve (not shown).

The injection system 1 has a housing 2, which comprises a housing interior space 3, which contains the fuel K, a first housing aperture 4 for the passage of a first contact device 5 and a second housing aperture 6 for the passage of a second contact device 7.

A piezo actuator 8 is arranged in the housing interior space 3. The piezo actuator 8 has a face plate 9, a base plate 10, a piezo stack 11 and a casing 14. The face plate 9 has a first face plate aperture 12 for the passage of the first contact device 5 and a second face plate aperture 13 for the passage of the second contact device 7. The piezo stack 11 can be controlled by means of a control voltage U and is arranged between the face plate 9 and the base plate 10. The controllable piezo stack 11 provides a lift as a function of the control voltage U to actuate a nozzle needle (not shown).

A sealed casing 14 which laterally surrounds at least the piezo stack 11 is arranged between the face plate 9 and the base plate 10. The casing 14 is preferably designed as a corrugated tube, which has a plurality of ripples and is in particular metallic.

The face plate 9, the base plate 10, the casing 14 and the piezo stack 11 restrict an actuator interior space 15. A transmission means 16 is arranged in the actuator interior space 15, which is suited to transmitting the fuel pressure P1 present on the exterior of the casing 14 to the piezo stack 11. To this end, the transmission means 17 has at least one fluid F having a fluid pressure P2. The fuel pressure P1 is preferably greater than 1500 bar, in particular greater than 2000 bar. During the transmission of the fuel pressure P1 to the piezo stack 11, the pressure is transmitted to the transmission element 16, so that the fluid pressure P2 essentially corresponds to the fuel pressure P1. The pressure difference between the fuel pressure P1 and the fluid pressure P2 amounts at the most to 200 bar. In particular, the fluid F is temperature resistant and/or heat conductive and/or electrically insulating. By way of example, the fluid F is a silicon oil.

The first contact device 5 is guided through the first housing aperture 4 and the first face plate aperture 12. The second contact device 7 is likewise guided through the second housing aperture 6 and the second face plate aperture 13. The two contact devices 5, 7 are in particular made of metal or invar. The first contact device 5 and the second contact device 7 contact the piezo stack 11 at its controller. In this way, the first contact device 5 is disposed on a first electrical potential PT1 and the second contact device 7 is disposed on a second electrical potential PT2, with the difference between the first electrical potential PT1 and the second electrical potential PT2 forming the control voltage U.

The injection system 1 also has a first sealing device 17*a*, 17*b*, which surrounds the contact devices 5, 7 in the region of the housing apertures 4, 6 and provides a seal between the housing interior space 3 and an exterior space 18 with a predetermined exterior space pressure P3. The exterior space pressure P3 is the atmospheric pressure for instance.

The first sealing device 17*a*, 17*b* has a first O-ring shaped sealing element 17*a*, which surrounds the first contact device 5 in the region of the first housing aperture 4 in a sealed manner, and a second O-ring shaped sealing element 17*b*, which surrounds the second contact device 7 in the region of the second housing aperture 6 in a sealed manner. The O-ring shaped sealing elements 17*a*, 17*b* are formed for instance from plastic, in particular from an elastomer.

Furthermore, the injection system 1 has a second sealing device 19*a*, 19*b* auf, which surrounds the contact devices 5, 7 in the region of the face plate apertures 12, 13 and provides a seal between the housing interior space 3 and the actuator interior space 15. The second sealing device 19*a*, 19*b* has a first sealing element 19*a*, which surrounds the first contact device 5 in the region of the first face plate aperture 12 in a sealed manner, and a second sealing device 19*b*, which surrounds the second contact device 7 in the region of the second face plate aperture 12 in a sealed manner. The sealing elements 19*a*, 19*b* are made of glass, for temperature stability reasons in particular.

The housing 2 also has a supply device 20, by means of which the fuel K is fed into the housing interior space 3 with the defined fuel pressure P1. The supply device 20 is designed for instance as a connection piece. The injection system 1 also has a force transmission element 21, which couples the housing 2 to the piezo actuator 8.

Figure 2:
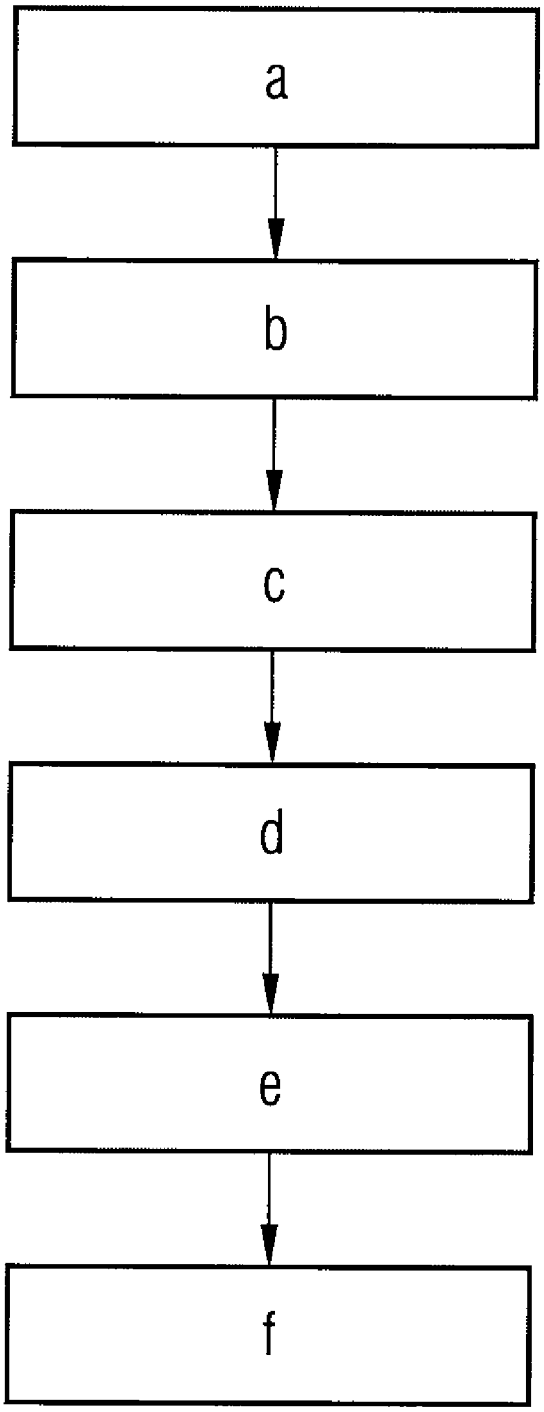
FIG. 2 shows a schematic flow diagram of the method for producing an injection system according to an embodiment.

The method according to an embodiment for producing the injection system 1 is described below with reference to the block diagram in FIG. 2. The method according to an embodiment may have the following method steps a-f:

Method Step a:

A housing 2 is provided, which has a housing interior space 3, comprising the fuel K, a first housing aperture 4 and a second housing aperture 6.

Method Step b:

A piezo actuator 8 is arranged in the housing interior space 3. The piezo actuator 8 has a face plate 9, which comprises a first face plate aperture 12 and a second face plate aperture 13, a controllable piezo stack 11 which is arranged between the face plate 9 and a base plate 10, a sealed casing 14 which laterally surrounds at least the piezo stack 11 and is arranged between the face plate 9 and the base plate 10 and a transmission means 16 which is arranged in an actuator interior space 15, said transmission means having at least one fluid with a fluid pressure P2.

Method Step c:

A first contact device 5 is arranged through the first housing aperture 4 and the first face plate aperture 12.

Method Step d:

A second contact device 7 is arranged through the second aperture 6 and the second face plate aperture 13.

Method Step e:

The housing interior space 3 is sealed in respect of an exterior space 18 with a predetermined exterior space pressure P3 by means of a first sealing device 17*a*, 17*b*, with the first sealing device 17*a*, 17*b* surrounding the contact devices 5, 7 in the region of the housing apertures 4, 6.

Method Step f:

The actuator interior space 15 is sealed in respect of the housing interior space 3 by means of a second sealing device 19*a*, 19*b*, with the sealing device 19*a*, 19*b* surrounding the contact devices 5, 7 in the region of the face plate apertures 12, 13.

Although the present invention was previously described with reference to preferred exemplary embodiments, it is not restricted thereto but can be modified in a variety of ways. By way of example, the piezo stack can be designed as a cylinder or also as a square.

The invention claimed is:

1. An injection system for injecting fuel with a predetermined fuel pressure comprising:

a) a housing, which has a housing interior space, which comprises the fuel, a first housing aperture and a second housing aperture;

b) a piezo actuator arranged in the housing interior space, which comprises:

b1) a face plate, which comprises a first face plate aperture and a second face plate aperture, b2) a controllable piezo stack which is arranged between the face plate and a base plate, b3) a sealed casing which laterally surrounds at least the piezo stack and is arranged between the face plate, and the base plate and b4) a transmission means which is arranged in an actuator interior space, said transmission means comprising at least one fluid with a fluid pressure;

c) a first contact device, which is guided through the first housing aperture and the first face plate aperture;

d) a second contact device, which is guided through the second housing aperture and the second face plate aperture;

e) a first sealing device, which surrounds the contact devices in the region of the housing apertures and provides a seal between the housing interior space and an exterior space with a predetermined exterior space pressure; and with f) a second sealing device comprising a first sealing element which surrounds the first contact device in the region of the face place aperture and a second sealing element which surrounds the second contact device in the region of the face place aperture and wherein the second sealing device provides a seal between the housing interior space and the actuator interior space, wherein at least one of the first and second sealing element consist of a glass;

wherein with the transmission of the fuel pressure to the piezo stack a pressure difference between the fuel pressure and the fluid pressure in the actuator interior space is produced, which is less than or equal to 200 bar.

2. The injection system according to claim 1, wherein the transmission means is suited to transmitting the fuel pressure which is present on the exterior of the casing to the piezo stack.

3. The injection system according to claim 1, wherein the controllable piezo stack provides a lift as a function of a control voltage for actuating a nozzle needle.

4. The injection system according to claim 3, wherein the first contact device and the second contact device contact the piezo stack to control the piezo stack, with the first contact device being disposed on a first electrical potential and the second contact device being disposed on a second electrical potential, with the difference between the first electrical potential and the second electrical potential forming the control voltage.

5. The injection system according to claim 1, wherein the actuator interior space is restricted by the face plate, the base plate, the casing and by the piezo stack.

6. The injection system according to claim 1, wherein the housing comprises a supply device for supplying the fuel with a predetermined fuel pressure into the housing interior space.

7. The injection system according to claim 1, wherein the first sealing device comprises a first O-ring-shaped sealing element, which surrounds the first contact device in the region of the first housing aperture in a sealed manner, and a second O-ring-shaped sealing element, which surrounds the second contact device in the region of the second housing aperture in a sealed manner.

8. The injection system according to claim 7, wherein the first O-ring-shaped sealing element and/or the second O-ring-shaped sealing element is/are designed from a plastic, in particular an elastomer.

9. The injection system according to claim 1, wherein the second sealing device comprises a first sealing element, which surrounds the first contact device in the region of the first face plate aperture in a sealed fashion, and comprises a second sealing element, which surrounds the second contact device in the region of the second face plate aperture in a sealed manner.

10. The injection system according to claim 9, wherein the first sealing element and/or the second sealing element consist of a glass.

11. The injection system according to claim 1, wherein the fuel pressure is greater than 1500 bar, in particular greater that 2000 bar.

12. The injection system according to claim 1, wherein the transmission means comprises the fluid and at least one preformed body, which consist in particular of a ceramic.

13. The injection system according to claim 1, wherein the casing is designed as a corrugated tube, which comprises a plurality of ripples and is in particular metallic.

14. The injection system according to claim 1, wherein the fluid is temperature-resistant and/or heat-conductive and/or electrically-insulating.

15. The injection system according to claim 14, wherein the fluid is designed as a silicon oil.

16. The injection system according to claim 1, wherein the injection system is designed as a common rail injection system.

* * * * *